US011164623B1

(12) United States Patent
Nakamura et al.

(10) Patent No.: US 11,164,623 B1
(45) Date of Patent: Nov. 2, 2021

(54) APPARATUSES, SYSTEMS, AND METHODS FOR DATA STROBE WRITE TIMING

(71) Applicant: MICRON TECHNOLOGY, INC., Boise, ID (US)

(72) Inventors: Kohei Nakamura, Fuchu (JP); Minari Arai, Niiza (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/903,102

(22) Filed: Jun. 16, 2020

(51) Int. Cl.
| G11C 7/00 | (2006.01) |
| G11C 7/10 | (2006.01) |
| G11C 8/00 | (2006.01) |
| G11C 8/18 | (2006.01) |
| G11C 11/4096 | (2006.01) |
| G11C 11/4094 | (2006.01) |
| G11C 11/4093 | (2006.01) |
| G11C 11/4076 | (2006.01) |
| G11C 7/22 | (2006.01) |

(52) U.S. Cl.
CPC ...... *G11C 11/4096* (2013.01); *G11C 11/4076* (2013.01); *G11C 11/4093* (2013.01); *G11C 11/4094* (2013.01); *G11C 7/1087* (2013.01); *G11C 7/1093* (2013.01); *G11C 7/22* (2013.01); *G11C 7/222* (2013.01); *G11C 2207/107* (2013.01)

(58) Field of Classification Search
CPC ............ G11C 11/4096; G11C 11/4076; G11C 11/4093; G11C 11/4094

USPC ...................................................... 365/189.05
See application file for complete search history.

(56) References Cited

U.S. PATENT DOCUMENTS

| 7,280,417 B2 * | 10/2007 | Choi ................... G11C 7/1078 365/189.05 |
| 2006/0250882 A1 * | 11/2006 | Choi ................... G11C 7/1087 365/189.05 |
| 2014/0029331 A1 * | 1/2014 | Gopalakrishnan ......................... G11C 11/4063 365/149 |

* cited by examiner

*Primary Examiner* — Ly D Pham
(74) *Attorney, Agent, or Firm* — Dorsey & Whitney LLP

(57) ABSTRACT

Apparatuses, systems, and methods for data strobe write timing. A memory device may receive a data strobe clock signal and serial write data during a write operation. A deserializer circuit of the memory may convert the serial write data into parallel write data using timing based on the data strobe clock signal. For example, one or more internal signals may be generated based on the data strobe clock signal and used to activate various operations of the deserializer circuit. The data strobe clock signal may also be used to activate bit lines of the memory device in order to write the parallel write data to memory cells along those activated bit lines. The memory may also receive a system clock, separate from the data strobe clock signal, which may be used for other operations of the memory. For example, in a read operation, the bit lines may be activated with timing based on the system clock.

21 Claims, 6 Drawing Sheets

US 11,164,623 B1

APPARATUSES, SYSTEMS, AND METHODS FOR DATA STROBE WRITE TIMING

BACKGROUND

This disclosure relates generally to semiconductor devices, such as semiconductor memory devices. The semiconductor memory device may include a number of memory cells which are used to store information. The stored information may be encoded as binary data, and each memory cell may store a single bit of the information. Write information may be provided at data terminals of the memory device in a serial stream and then deserialized into parallel information which may be stored in latches of the device until it is loaded into the memory cells. Read information may be read out from the memory cells into the latches in parallel, and then serialized to provide the information at the data terminals. The memory device may perform these operations with timing based on various clock signals, which may be supplied through clock terminals of the device.

DETAILED DESCRIPTION

Figure 1:
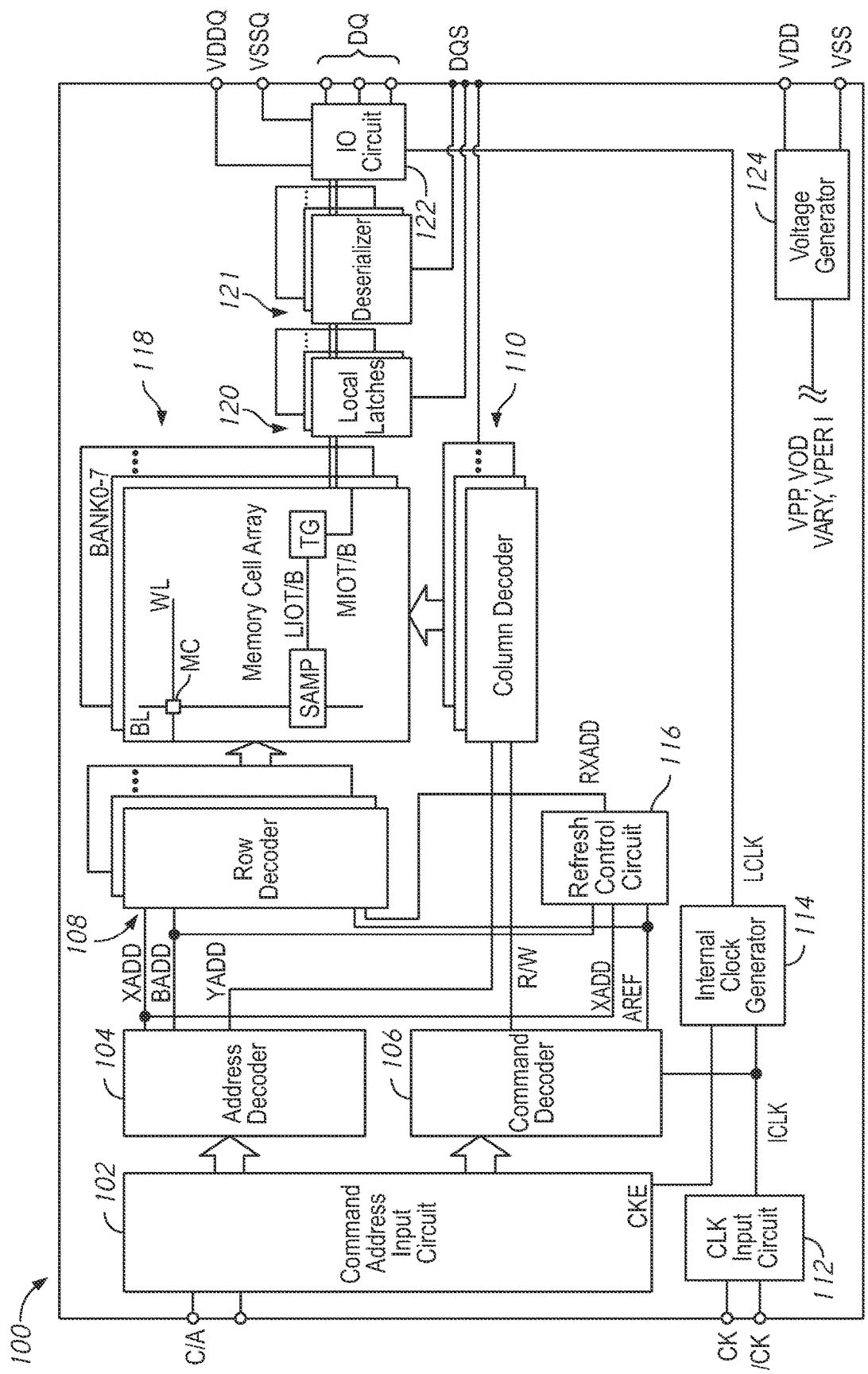
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device may include a memory array which has a number of memory cells, each located at the intersection of a word line (row) and digit line (columns or bit lines). During an access operation, such as a read or write operation, one or more rows and columns may be activated, and data may be read from, or written to, the memory cell(s) at the intersection of the activated row(s) and column(s). For example, during a write operation data may be supplied to a data terminals of the device, while a write command and an address which specifies which memory cells the data are to be written to are supplied at command and address (e.g., C/A) terminals. In addition, clock signals such as system clock CLK and a data strobe clock signal (DQS) are supplied at various clock terminals. The data strobe clock may be used to manage the timing of loading data from the data terminals into local latches associated with the memory array, while the clock signal is used to manage the timing of loading data from those local latches into the memory array. However, this utilizes a second set of local latches, which are clocked off of the clock signal CLK, to manage switching between the timing domains of the memory (e.g., from DQS to CLK). This second set of latches may consume power and space on the memory device. It may be desirable to unify the clock domains used in the write operation to reduce the number of latches in the write path.

The present disclosure is drawn to apparatuses, systems, and methods for data strobe signal write timing. In a memory device according to some embodiments of the present disclosure, rather than transfer from a DQS domain to a CLK domain, the data may remain in the DQS domain all the way from the data terminals into the memory array. The DQS clock signal may be used to manage the timing of loading data from the data terminals into the local latches, and from the local latches into the memory array. For example, the DQS signal may be used to manage the timing of a deserializer, which converts serial received write data into parallel write data at the local latches, and also used to control the activation of the bit lines of the memory to control the loading of data from the local latches into the memory cells. The CLK domain may still be used to read data back out of the memory array and out to the data terminals.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL, and a plurality of memory cells MC arranged at intersections of the plurality of word lines WL and the plurality of bit line BL. The selection of the word line WL is performed by a row decoder 108 and the selection of the bit lines BL is performed by a column decoder 110. In the embodiment of FIG. 1, the row decoder 108 includes a respective row decoder for each memory bank and the column decoder 110 includes a respective column decoder for each memory bank. The bit lines BL are coupled to a respective sense amplifier (SAMP). Read data from the bit line BL is amplified by the sense amplifier SAMP, and transferred to read/write amplifiers over complementary local data lines (LIOT/B), transfer gate (TG), and complementary main data lines (MIOT/B) to the local latches 120. The data may then be provided to a serializer (not shown) and then the serialized data may be provided to the data terminals DQ through the I/O circuit 122. Conversely, write data is transferred from the DQ pads to the local latches 120 through a deserializer 121. From the local latches 120, the write data is transferred to the sense amplifier SAMP over the complementary main data lines MIOT/B, the transfer gate TG, and the complementary local data lines LIOT/B, and written in the memory cell MC coupled to the bit line BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The memory device 100 also includes data strobe terminals DQS. The data strobe signal may be used to manage the timing of write operations to the memory device 100, while the system clock signal(s) CLK and /CLK may manage timing of other operations, such as read operations, refresh operations, and other operations. The system clock(s) CLK and /CLK may be provided to the device 100 continuously while the device 100 is in operation (e.g., is powered on). The data strobe clocks DQS may be provided during write operations, but may not be provided at other times. For example, a certain number of periods (e.g., a certain number of rising edges) of the data strobes DQS may be provided for each write operation.

Although a single data strobe terminal is shown in FIG. 1, it should be understood that there may be a number of terminals for receiving one or more sets of DQS signals. For example, a set of DQS signals may include a pair of complimentary signals (e.g., DQST and DQSF). In some embodiments, the memory device 100 may receive multiple sets of DQS signals. For example, each set of DQS signals may be associated with a certain number of the data terminals DQ (e.g., complimentary signals DQSTa and DQSFa may be associated with 8 data terminals DQa, complimentary signals DQSTb and DQSFb may be associated with 8 data terminals DQb, etc.).

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that data is read out from memory cells (e.g., along the LIO and MIO) to the local latches 120. The data may be read out with timing based on the clock signals CK and /CK. The data may be read out in parallel (e.g., at the same time along multiple bit lines BL, LIO, and MIO's) and provided to a serializer circuit (not shown) which may shift the data into series (e.g., multiple bits sequentially along a data line). The serialized data may then be provided through the IO circuits 122 to the data terminals DQ. The serializer and IO circuits 122 may operate using timing based on the system clock signals (e.g., CK and /CK or clock signals derived therefrom).

The device 100 may receive an access command which is a write command. When the write command is received, and a bank address, a row address and a column address are timely supplied with the write command, and write data is supplied through the DQ terminals to the deserializer circuits 121. The deserializer circuits 121 may receive serial data from the IO circuits 122, and then convert the serial write data into parallel data. The deserializer may then provide the parallel write data to the local latches 120. The deserializer circuit 121 and local latches 120 may operation using timing based on one or more data strobe signals (e.g., DQS or signals derived therefrom). The write data is provided along the global data bus and saved in the local latches 120 associated with the bank indicated by the bank address. The write data stored in the local latches 121 is written to a memory cells in the memory array 118 corresponding to the row address and column address. The write command is received by the command decoder 106, which provides internal commands so that the write data is received by data receivers in the input/output circuit 122. The internal commands may be issued to the memory array using timing based on one or more of the data strobe signals DQS. In this manner, the write data may be governed by the data strobe signals DQS (in contrast to read operations, which are governed by the system clocks such as CK).

The device 100 may also receive commands causing it to carry out one or more refresh operations as part of a self-refresh mode. In some embodiments, the self-refresh mode command may be externally issued to the memory device 100. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and return to an IDLE state. The refresh signal AREF is supplied to the refresh control circuit 116. The refresh control circuit 116 supplies a refresh row address RXADD to the row decoder 108, which may refresh one or more wordlines WL indicated by the refresh row address RXADD.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
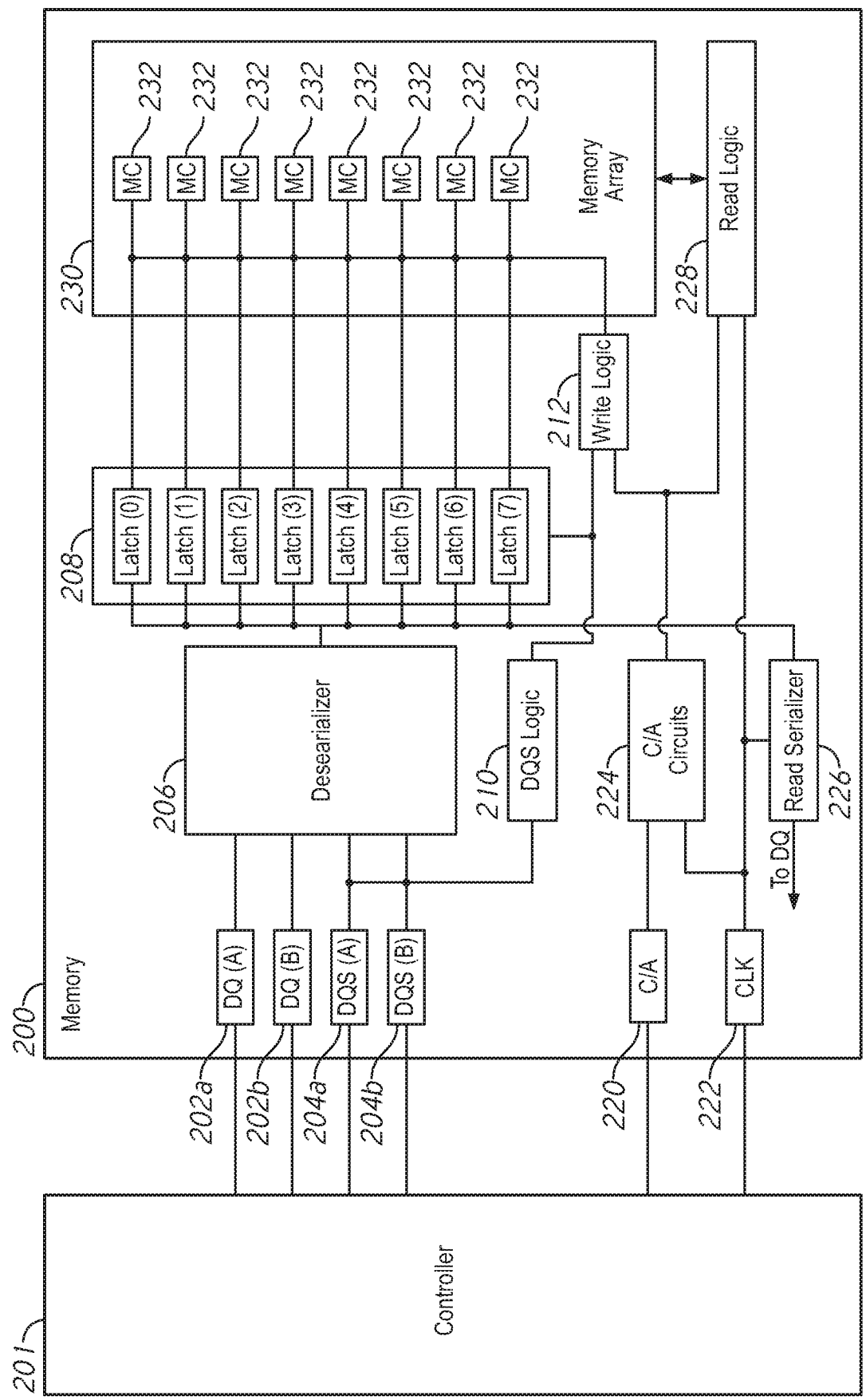
FIG. 2 is a block diagram of a memory device according to some embodiments of the present disclosure.

FIG. 2 is a block diagram of a memory device according to some embodiments of the present disclosure. The memory device 200 may certain components of a write and read path of a memory device, such as the memory device 100. To explain the functioning of the write and read path, certain components of the memory may be simplified and/or omitted in the representation of FIG. 2. The memory device 200 is coupled to a controller 201, which may operate the memory device 200 to, for example, read and write data to and from the memory device 200.

The controller 201 may be coupled to one or more terminals of the memory device 200 to provide control signals (e.g., read/write commands, clock signals, addresses) and/or to send/receive data. The controller 201 may be coupled to various terminals of the memory device 200 along 'pins' or other conductive elements. The controller 201 may provide some signals as long as the memory device 200 is in operation. For example, the clock signal CLK may be provided to a clock terminal 222 as long as the memory 200 is active. The controller 201 may provide some signals as part of specific operations. For example, as part of an example write operation, the controller 201 may begin providing one or more data strobe signal(s) DQS to one or more data strobe terminals 204a-b, provide commands and addresses to a C/A terminal 220, and provide write data in a serial format to write terminals 202a-b. In some embodiments, the controller 201 may provide these signals for a set time, and then stop providing these signals.

The memory 200 includes a first set of data terminals DQ(a) 202a and a second set of data terminals DQ(b) 202b. Each of these sets of data terminals 202a-b may represent several individual data terminals. For example each of the sets of terminals 202a-b may include a number of individual terminals (e.g., four terminals, eight terminals, 16 terminals). Similarly, while only two sets of data terminals 202a and 202b are shown, a memory device may have more or fewer sets of data terminals. During a write operation, each terminal in one or both of the sets of terminals 202a-b may receive a number of write data bits in series from the controller 201. For example, each data terminal may receive a first bit followed by a second bit, then a third bit, etc. The serial write data may be received in a set length of time such as a data period. The amount of time each bit is provided before the next bit is provided may be based on the timing of the data strobe clock signal DQS.

During a write operation, the memory device 200 may also receive data strobe signals DQSa and DQSb over respective data strobe terminals 204a-b from the controller 201 as part of a write operation. Each data strobe terminal 204a-b may represent a number of individual terminals. For example, in some embodiments, the data strobe terminal DQSa 204a may include two terminals, which may receive a data strobe signal DQSTa and its compliment DQSFa. The data strobe clock signal(s) DQS may be binary signals which change between a high and low logical level with regular timing. A certain waveform of the clock signal may occur with predictable timing. For example, the data strobe clock signal DQS may alternate between a high and low level. In another level, a rising edge or pulse may occur with regular timing. The controller 201 may provide such a signal by using a first voltage to represent a high logical level and a second voltage to represent a low logical level. When the data strobe clock signal DQS is not being provided, the controller 201 may hold the data strobe clock terminal 204a and/or 204b at a constant logical level (e.g., a constant voltage).

The first data strobe terminal DQS(A) may receive one or more first data strobe signals DQSa, which are associated with the first set of data terminals 202a. Similarly, the second data strobe terminal DQS(B) may receive one or more second data strobe signals DQSb, which are associated with the second set of data terminals 202b. For example, when the controller 201 is providing serial write data along first data terminal DQ(a) 202a, the controller 201 may also provide the first data strobe signal DQS(a) along the first set of data strobe terminals 204a. The use of separate groups of DQS and DQ terminals may be useful to help manage the precise timing at which different bits of serial data are provided. Although two sets of data terminals 202a-b and data strobe terminals/signals 204a-b are shown in FIG. 2, in some embodiments, more or fewer data terminals 202a-b and data strobe terminals 204a-b may be used.

During a write operation, the data from the controller 201 may be provided through data terminals 202a-b to a deserializer circuit 206. The data along the data terminals 202a-b may be provided in series. For example, each individual data terminal may receive 8 bits of write data in series. More or fewer bits per data period may be used in other example embodiments. The deserializer circuit 206 may split the received information into parallel transmission, and provide the parallel write data to local latches 208. For example, if 8 bits are provided in series along the data terminal, then the deserializer circuit 206 may split the 8 bits into 8 different conductive lines, and the each bit of the data may be provided along one of those 8 different conductive lines to each of 8 different respective local latches 208. The operation of a deserializer circuit is discussed in more detail in FIG. 3.

Once the data is stored in the local latches 208, write logic 212 may activate one or more bit lines in the memory array 230 based on an address received through the C/A terminal 220 to the C/A circuits 224. For example, a column address and write command may be provided by the controller 201 at the C/A terminal 220. The C/A circuits 224 may decode the address, and signal that the write logic 212 should activate the bit lines associated with the memory cells 232 indicated by the address. The write logic 212 may activate the bit lines of the memory array 230 with timing based on the data strobe signals.

The deserializer circuit 206 local latches 208, and write logic 212 may operate in a DQS domain. In other words, the deserializer circuit 206, local latches 208 and write logic 212 may operate with timing based on the data strobe signal(s) DQSa and/or DQSb. For example, the circuits 206, 208, and 212 may operate based directly on the signals DQSa/b, and/or more operate with timing of various internal clock signals generated from the data strobe signals DQSa/b.

The memory 200 may include a DQS logic circuit 210, which may receive one or more data strobe signals from the data strobe terminals 204a-b, and may provide one or more internal signals which are generated with timing based on the data strobe signals. The DQS logic circuit 210 may provide timing signals which may operate the deserializer circuit 208, the local latches 208 and/or write logic 212. The operation of these components in the DQS domain is discussed in more detail in FIG. 3.

Unlike the write operation in the DQS domain, a read operation may operate in a system clock CLK domain. The memory 200 may receive one or more system clock signals CLK from the controller 201 at a CLK terminal(s) 222. Various internal clock signals may be based on the system clock signals. When read command, along with valid address(es), are received at the C/A terminals 220, the C/A circuits 224 may instruct read logic circuits 228 to activate the rows and columns specified by the address. Data may be read out from the activated memory cells 232 of the memory array 230 to the local latches 208. The data may be read out from the local latches 208 to a read serializer 226. The serializer may operate to convert the parallel information from the local latches into serial data, which may then be provided to the data terminals (e.g., 202a-b). The read logic 228 and serializer 226 (as well as the local latches 208 during a read operation) may operate with timing based on the system clock 222.

Figure 3:
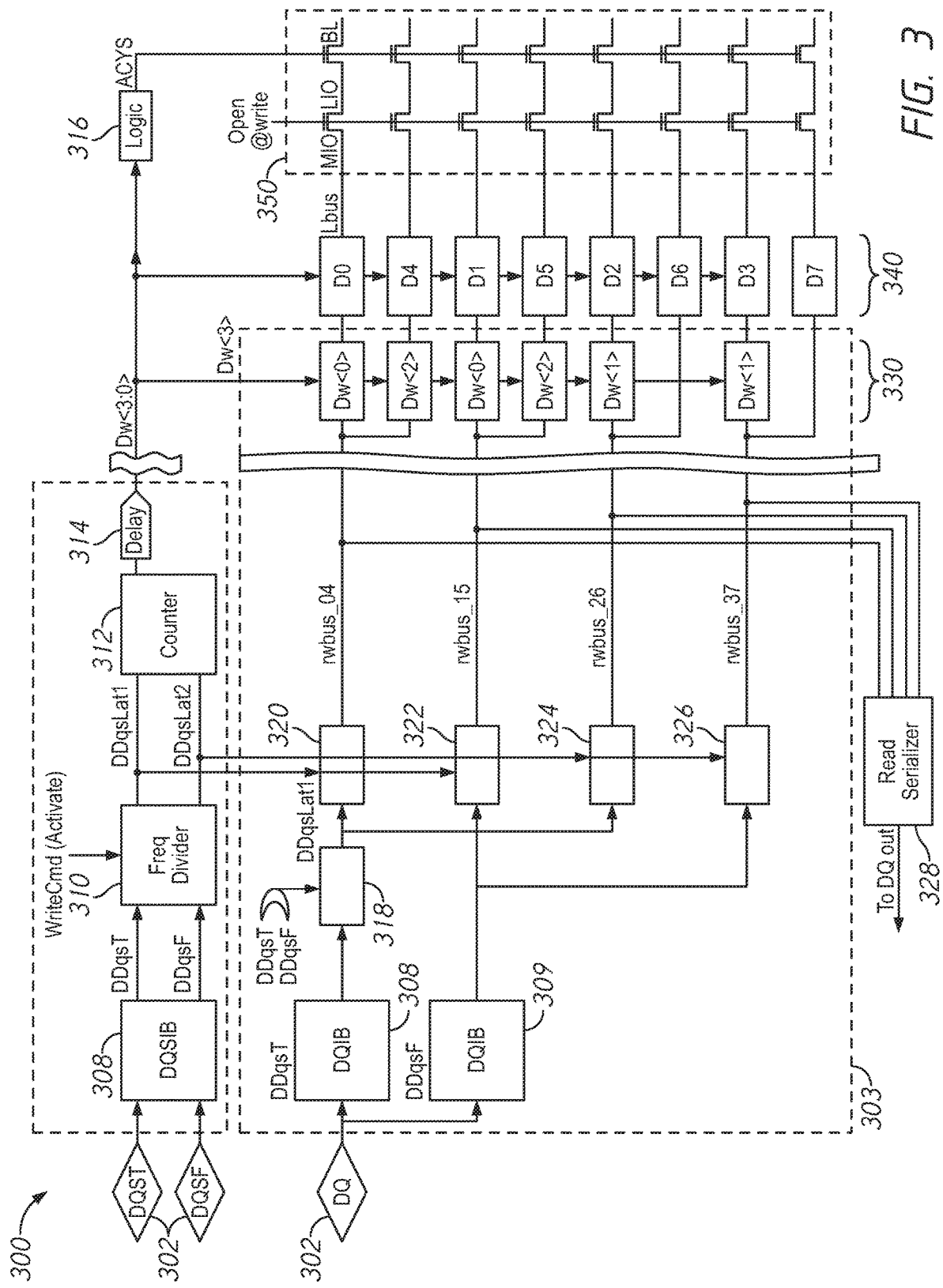
FIG. 3 is a block diagram of a memory according to some embodiments of the present disclosure.

FIG. 3 is a block diagram of a memory according to some embodiments of the present disclosure. The memory 300 may represent a write path of a memory such as the memories 100 of FIG. 1 and/or 200 of FIG. 2. As with FIG. 2, for brevity and clarity, certain components of the memory 300 have been omitted. The memory 300 includes DQS logic 301, which generates various internal timing signals based on the data strobe signals DQST and DQSF. The memory 300 also includes a deserializer 303, which receives data from the data terminals DQ 302 in a serial format and converts it to parallel format (with timing based on the signals from the DQS logic 301) before providing it in parallel to the local latches 340.

The memory 300 includes data strobe terminals 304. In particular the memory 300 includes a first data strobe terminal and a second data strobe terminal. The terminals receive signals DQST and DQSF which are complimentary to each other. In other words the signals DQST and DQSF may have the same frequency, but may be 180 out of phase° with each other. The signals DQST and DQSF may be provided to the memory 300 as part of a write operation. For example, the data strobe clocks may be provided along with a write command and address. In some embodiments, the data strobe clocks may continue to be provided for a set number of periods and then may stop being provided.

The clock signals DQST and DQSF are provided to a data strobe input buffer (DQSIB) 306. The input buffer 306 may alter one or more aspects of the provided clock signals. For example, the input buffer 306 may stabilize the signal to reduce noise, or may alter the voltage levels of the signals. The input buffer 306 provides buffered clock signals DDqsT and DDqsF. The buffered signals are provided to a frequency divider 310, which produces divided clocks DDqsLat1 and DDqsLat2 based on the signals DDqsT and DDqsF respectively. The divided clocks DDqsLat1 and DDqsLat2 may have a lower frequency than the signals DDqsT and DDqsF. For example, the divided clock DDqsLat1 may have a pulse half as often as the signal DDqsT.

The divided signals DDqsLat1 and DDqsLat2 are provided to a counter circuit 312, which changes a count signal each time an activation (e.g., a pulse) of one of the clock signals DDqsLat1 or DDqsLat2 is received. The count signal is provided through a delay circuit 314 to generate a signal Dw. The signal Dw may be a multi-bit signal which has a state based on the number of times that an activation (e.g., a pulse) of one of the divided signals DDqsLat1 or DDqsLat2 is received by the counter circuit 312. For example, a first bit of the signal Dw may be active (e.g., at a high logical level) a first time one of the signals is received, a second bit may be active the second time of the signals is received and so forth. Other methods of representing the count 312 as a signal may be used in other examples. In some embodiments, such as the one shown in FIG. 3, the signal Dw (and the number in the counter circuit 312) may be a 4 bit signal. In some embodiments, more or fewer bits of the signal Dw and counter 312 may be used. In some embodiments, the number of bits of the signal Dw and counter 312 may be based on a number of local latches 340. For example, there may be half as many bits of the signal Dw and the counter 312 as there are local latches 340. The counter 312 may be used to measure the length of a data period (e.g., the length of time over which all 8 bits are provided as part of the data stream DQ). For example, the time it takes for a final bit of the signal Dw (e.g., Dw<3>) to become active may represent a data period. In some embodiments, the final bit of the count signal Dw may act as a command signal to indicate that parallel write data is ready. The delay circuit 314 may act as a delay to help match the timing of the count signal to the timing of the bits along the read/write bus.

The memory 300 also includes a deserializer circuit 303. A data terminal 302 receives data DQ as a serial signal. The signal DQ may be a sequence of bits which represent several bits of write data. For example, the embodiment of FIG. 3 shows an example where a single data terminal 302 receives a sequence of data DQ which is 8 bits long. It should be understood that only a single data terminal 302 is shown for clarity, but that in other embodiments the deserializer 303 may be coupled to several data terminals. Similarly, while the deserializer 303 is shown as coupled to a single set of data strobe terminals 304, more or fewer data strobe terminals may be used in other example embodiments.

The deserializer 303 includes a pair of data input buffers 308 and 309. The first data input buffer 308 is clocked to the signal DDqsT (e.g., the buffered data strobe DQST), while the second data input buffer 309 is clocked to the signal DDqsF (e.g., the buffered data strobe DQSF). The input buffers 308 and 309 may act as latches, which may latch and provide a bit of the input data DQ responsive to a portion of the clock signal (e.g., the rising edge of the coupled clock signal). Since the data clocks DDqsT and DDqsF are complimentary, each of the input buffers 308 and 309 may latch alternate bits in the serial data DQ. Accordingly, the first input buffer 308 may latch and provide even bits of the data stream d0246, while the second input buffer 309 may latch and provide odd bits of the data stream d1357.

The deserializer 303 includes a latch 318 which may be used to 'shift' the even data bits d0246 to align them with the odd bits d1357. Since the data bits arrived in series, and were timed off of complimentary clock signals, the odd bits d1357 may be offset by half a clock cycle with respect to the even bits d0246. In the embodiment of FIG. 3, the latch 318 may delay the odd data signals by a half clock cycle in order to align the even and odd bits. For example, the latch 318 may be clocked to both the signals DDqsT and DDqsF, which may be combined through an OR gate. Accordingly, the latch 318 may latch the even data and provide it on both the rising edges of the data strobe and also the falling edges (which are the rising edges of the complimentary data strobe).

The delayed even data d0246 is provided to latches 320 and 324, while the odd data d1357 is provided to latches 322 and 326. The latches 320 and 322 are clocked to the signals DDqsLat1 (e.g., the frequency divided DDqsT) while the latches 324 and 326 are clocked to the signals DDqsLat2 (e.g., the frequency divided DDqsF). Accordingly, the latches 320-326 each latch and provide every other one of the received even or odd bits. Thus, the latch 320 provides the bits 0 and 4 as the signal rwbus_04, while the latch 324 provides the bits 2 and 6 as the signal rwbus_26. Similarly the latch 322 provides rwbus_15 and the latch 326 provides the signal rwbus_37. These signals (e.g., rwbus_04, rwbus_15, rwbus_26, and rwbus_37) may be provided along a read/write bus (e.g., rwbus).

The read/write bus may provide the signals through the memory to a region proximate to the memory array, where the rwbus signals may be latched by intermediate latches 330. The intermediate latches 330 may be used to separate the two signals along each conductive element of the read/write bus (e.g., to split the signal rwbus_04 which includes serial bits D0 and D4 into parallel bits D0 and D4). The intermediate latches 330 may also add an element of time delay such that the data provided from the intermediate latches 330 is in parallel.

The first pair of intermediate lat5ches 330 receive the signals rwbus_04 and are clocked to the first and third bits of the count signal Dw (e.g., Dw<0> and Dw<2>). The latch clocked to Dw<0> may latch the first bit of dwbus_04 (e.g., 0) while the latch clocked to Dw<2> may latch the second bit of dwbus_04 (e.g., bit D4). Similarly a second pair of the intermediate latches 330, also clocked to Dw<0> and Dw<2>) may separate rwbus_15 into bits 1 and 5. The other signals rwbus_26 and rwbus_37 may be clocked using Dw<1>, but not Dw<3>, as no further delay is required to bring the bits D6 and D7 into parallel with the other bits. Accordingly, the signal rwbus_26 is received by a latch clocked to Dw<1> to provide the bit D2, and is also passed directly to the local latches to provide the signal D6. Similarly, another latch clocked to Dw<1> separates bits D3 and D7, and provides bit D3, while the bit D7 is passed directly to the local latches 340.

The local latches 340 accordingly receive each of the bits D0 to D7 in parallel, based on the states of the bits in the data stream DQ. The local latches 340 are clocked to the final bit of the count from the counter 312 (e.g., Dw<3>). Each local latch holds one of the bits D0 to D7 which was provided as part of the data stream DQ at the data terminal 302. At this point, the received data are in parallel and may be provided into the memory array 350. The deserializer 303 splits the received data stream DQ into the parallel bits D0 to D7 in the local latches 340 based on signals derived from the data strobe signals DQST and DQSF. In addition, the timing of writing the data in the local latches 340 to the memory array 350 may also be controlled using internal signals (e.g., Dw<3:0>).

The memory array 350 receives the data bits D0 to D7 from the local latches 340 along a local bus Lbus which transitions to a main input/output MIO bus. The local bus and MIO bus may include a number of conductive elements which each carry one of the data bits in parallel. Switches, such as transistors, act as a transfer gate to transfer the data from the MIO bus onto local input/output (LIO) busses. The transistors which couple the MIO and LIO bus may be activated by write command (e.g., from a C/A circuit). The data along the LIO buses may be coupled onto the bit lines (BL) associated with a column address provided with the write command by switches (e.g., transistors) which may be activated by a column select signal ACYS. The column select signal ACYS may be provided with timing based on the counter signal Dw.

A column activation logic circuit 316 is coupled to the count signal Dw provided by the delay circuit 314. In some embodiments, the column activation logic circuit 316 may also receive a column address (not shown). In some embodiments, the column activation logic circuit 316 may receive one or more internal signals generated by a column decoder (e.g., 110 of FIG. 1) based on the column address. The column activation logic circuit 316 may provide a column signal ACYS, which may be a multi-bit signal directed to the switches which activate (e.g., couple to the LIO) various bit lines. The bits of the column select signal ACYS may activate individual bit lines. The bits of the column select signal ACYS may be provided at an active level based on the column address with timing based on the signal Dw. For example, the active bit(s) of the column select signal ACYS may be provided based on when the bit Dw<3> becomes active (which may indicate that the local latches 340 have been loaded). The column activation logic circuit 316 may be independent of the system clock signal (e.g., CK of FIG. 1). Accordingly, the bits of the column select signal ACYS may be activated with timing based on the data strobe signal DQS (e.g., through the signal Dw<3>) but not based on the system clock (e.g., CK of FIG. 1).

Various components of the data strobe logic 301 and/or deserializer 303 may be repeated in embodiments which use multiple data strobe signals and/or data streams. For example, in embodiments where multiple data terminals are used then the deserializer 303 may be repeated for each data terminal. In embodiments where multiple data strobe signals are used, then both the data strobe logic 301 and deserializer 303 may be repeated (e.g., a data strobe logic for each data strobe signal and a deserializer 303 for each data terminal associated with that data strobe signal).

The memory device 300 also includes a read serializer 328, which may be used to obtain data from the memory array 350 as part of a read operation. Unlike the write operation, the read operation may be governed by timing based on system clock (e.g., CLK). The read serializer may receive data from the read/write buses and then arrange that data into a serial set of data bits, in a process which is generally the inverse of the operation of the deserializer circuit 303. The read serializer 328 may be operated with timing based on one or more internal signals based on the system clock.

Figure 4A:
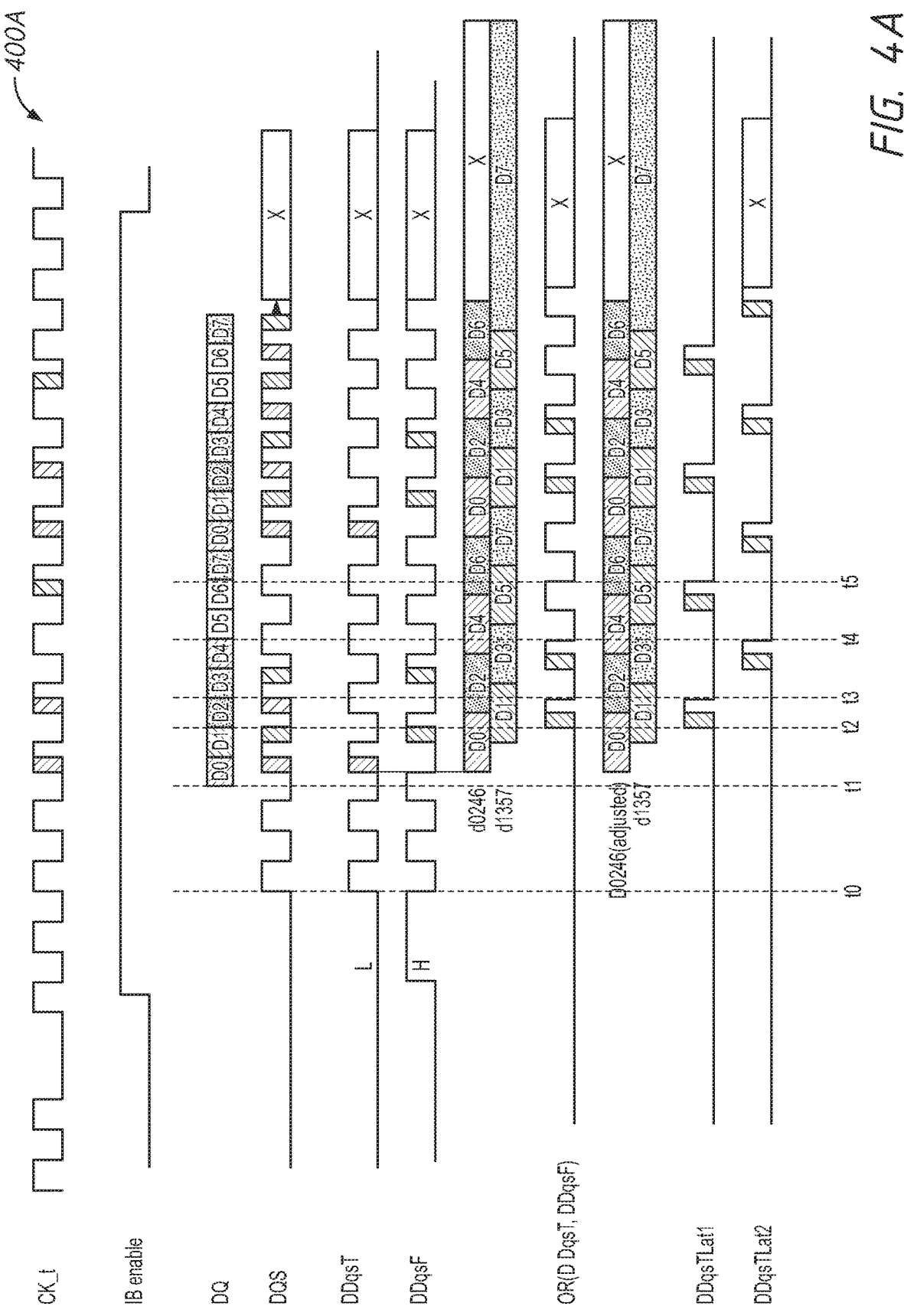
FIGS. 4A-4B are a timing diagram of the operation of a write operation according to some embodiments of the present disclosure.
Figure 4B:
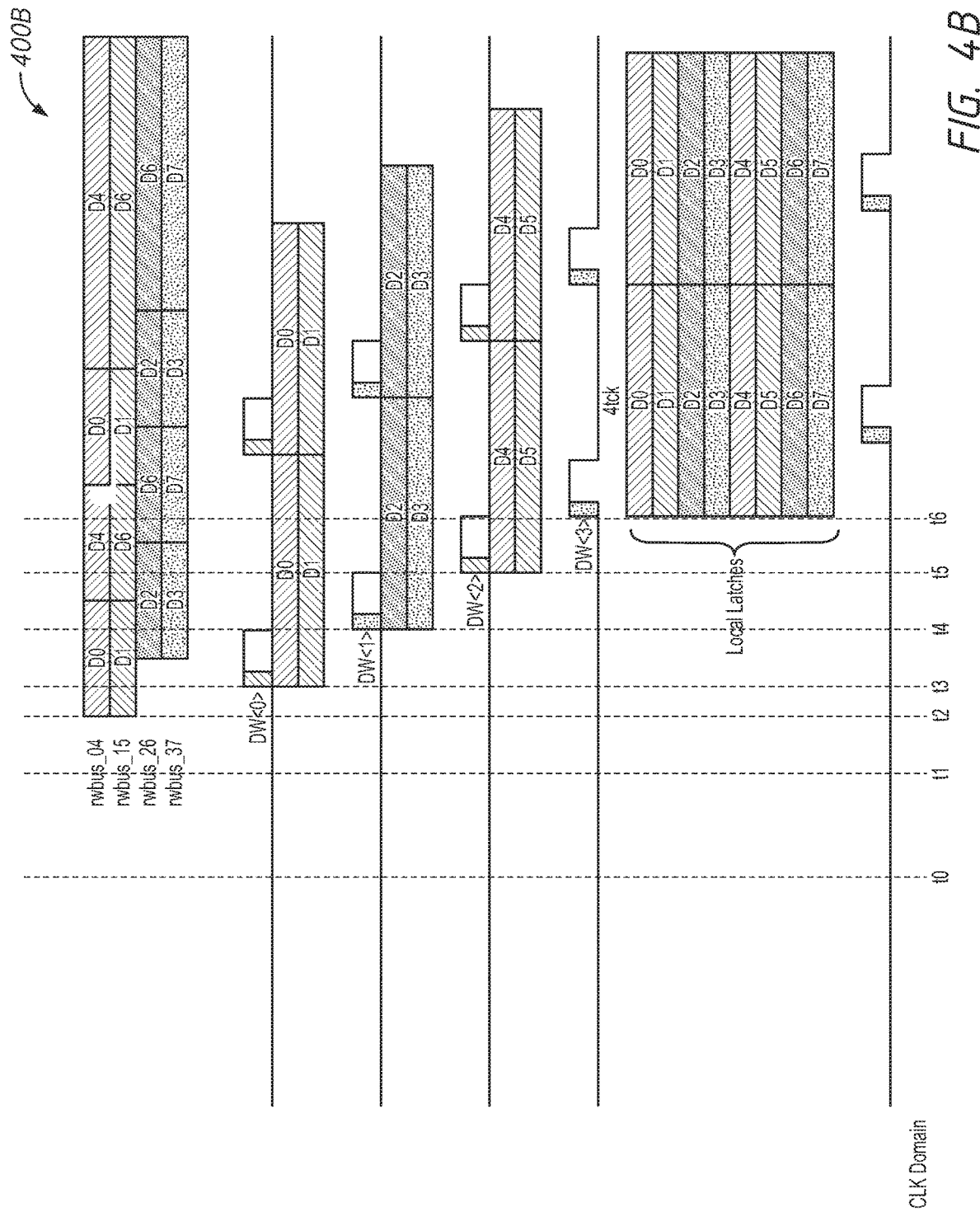

FIGS. 4A-4B are timing diagrams of the operation of a write operation according to some embodiments of the present disclosure. The timing diagram 400 shows various signals and timing operation which may, in some embodiments, be used by the memory 300 of FIG. 3. To allow for a better view of certain operations, the write operation has been split into timing diagrams 400*a* and 400*b*, which may share a time access, and represent portions of a single write operation. Accordingly, the time points (e.g., t0, t1, etc.) shown on FIG. 4A may be the same as the time points shown on FIG. 4B.

The timing diagram shows a system clock CK_t which runs continuously while the system is active. At an initial time t0, the data strobe signal DQS may begin being provided, which indicates that a data is about to be transmitted over the data terminals. Only a single signal DQS (e.g., DQST is shown), however a second data strobe which is complementary to the shown signal may also be provided. The data strobe signal may be a periodic signal which switches between a high and low logic level with regular timing. At a time t1, after the data strobe DQS begins being provided, data stream DQ may be provided at the data terminals. The data stream may be a number of bits provided in serial format. In the example embodiment of FIG. 4 there are eight bits D0 to D7 provided as part of the data stream DQ (e.g., similar to example of FIG. 3).

The memory provides buffered clock signals DDqsT and DDqsF based on the data strobe signals DQS (and its compliment, not shown). The clock signal DDqsT is in phase with the signal DQS, and has the same frequency. The clock signal DDqsF is out of phase with the signal DQS (e.g., by 180 degrees to make it complimentary). Based on the timing of DDqsT and DDqsF, the memory may separate the input data stream DQ into even bits d0246 and odd bits d1357. The data stream DQ may switch between serial bits twice as fast as the data strobe signal DQS. As may be seen, the rising edge of the signal DDqsT may coincide with the even bits. Accordingly a latch (e.g., 308 of FIG. 3) which receives the input data DQ and is clocked to DDqsT may latch every other bit starting with the first bit (e.g., D0). Similarly, the rising edge of the signal DDqsF may coincide with odd bits of the input data DQ. Accordingly, a latch (e.g., 309 of FIG. 3) which receives the input data DQ and is clocked to DDqsF may latch and provide the odd bits starting with the second bit (e.g., D1).

A clock signal OR(DDqsT, DDqsF) represents the output of an OR gate which is used to clock a latch (e.g., 318 of FIG. 3), which is used to begin aligning the even and odd data signals d0246 and d1357. It does this by moving the timing of d0246 relative to d1357. The clock signal OR(DDqsT, DDqsF) may represent the logical OR operation performed on the clocks DDqsT and DDqsF, and may be used to clock a latch which receives the signal d0246. That latch provides a signal d0246(adjusted) which is delayed by a half a clock cycle (e.g., one half the frequency of DDqsT) relative to d1357. As may be seen this may increase the amount of time where D0 and D1 (as well as D2 and D3, D4 and D5, D6 and D7) are overlapping.

A frequency divider circuit (e.g., 310 of FIG. 3) provides divided data strobe clocks DDqsLat1 and DDqsLat2 based on DDqsT and DDqsF respectively. The signal DDqsLat1, for example, provides half the pulses of DDqsT. In this manner, rising edges of DDqsLat1 happen with half the frequency of rising edges of DDqsT. In a similar manner, rising edges of DDqsLat2 happen with half the frequency of rising edges of DDqsF.

Starting at a time t2, the signals DDqsLat1 and DDqsLat2 may be used to capture bits from the adjusted even bits d0246(adjusted) and the odd bits d1357. A number of latches (e.g., 320 to 326 of FIG. 3) may be used to capture bits from d0246(adjusted) and odd bits d1357. For example, the first activation of DDqsLat1 may occur at a time when the bits D0 and D1 are both active on d0246(adjusted) and d1357 respectively. A first latch (e.g., 320 of FIG. 3) which receives d0246(adjusted) and is clocked to DDqsLat1 may grab the value D0 and provide it along a read/write bus rwbus_04. A second latch (e.g., 322 of FIG. 3) which receives d1357 and is clocked to DDqsLat1 may grab the bit D1 and provide it along a bus rwbus_15. In a similar fashion, the first activation of DDqsLat2 may happen when bits D2 and D3 are both active. A third latch (e.g., 324) clocked to DDqsLat2 may latch and provide D2 along rwbus_26, while a fourth latch (e.g., 326 of FIG. 3) clocked to DDqsLat2 may latch and provide D3 along rwbus_37.

The second activation of DDqsLat1 may occur when the bits D4 and D5 are active in the adjusted even bits d0246(adjusted) and the odd bits d1357 respectively, while the second activation of DDqsLat2 may occur while the bits D6 and D7 are active in the adjusted even bits d0246(adjusted) and the odd bits d1357 respectively. In this manner, the first latch (e.g., 320 of FIG. 3) may provide D4 as the signal rwbus_04, and the other latches may similarly provide D5, D6, and D7.

Beginning at a third time t3, a counter signal Dw may be used to align the bits D0 to D7 by saving them into local latches (e.g., 340 of FIG. 3). A set of preliminary latches (e.g., 330 of FIG. 3) may be used to help align the data along the read/write bus which is ready first (e.g., D0 and D1) with the data which is ready at a later time (e.g., D6 and D7). The count signal Dw may be provided by a counter circuit (e.g., 312 of FIG. 3) and delay circuit (e.g., 314 of FIG. 3). The counter circuit may receive the signals DDqsLat1 and DDqsLat2 and change the count signal Dw each time there is a pulse (e.g., a rising edge) of either of the clock signals. For example, Dw may be a multi-bit signal, and each time a pulse of one of the clock signals is received, a different bit of Dw may be active. So a first bit Dw<0> may be active the first time a pulse DDqsLat1 or DDqsLat2 is received, a second bit Dw<1> may be active the second time a pulse DDqsLat1 or DDqsLat2 is received and so forth. Due to the delay circuit, each bit Dw may become active a time after the pulse of the clock signal is received. The delay may model a propagation delay through the various latches of the deserializer circuit.

A first intermediate latch may be clocked to the first bit Dw<0> and is coupled to dwbus_04, a second intermediate latch may be clocked to the first bit Dw<0> and may be coupled rwbus_15. At a time t3, the bit Dw<0> becomes active, and the values D0 and D1 are latched by the first and second intermediate latches. Similarly at a time t4 when the bit D<1> becomes active, a third and fourth intermediate latch may latch values D2 and D3. At a time t5, a fifth and sixth intermediate latch may latch values D4 and D5. At a time t6, the bit Dw<3> may activate, which may cause the local latches to each latch one of the values D0 to D7. At this point, the data may be in parallel in the local latches.

The timing diagrams 400*a-b* shows two different data streams DQ, each with eight bits D0 to D7 being received in serial. Each of these data streams is then deserialized and loaded into the local latches in series. For example a first group of eight bits of data D0 to D7 is loaded in at time t6, and at a later time, replaced with a next group of eight bits of data D0 to D7. The data strobe DQS may be provided during write operations, and may end once the data is provided. For example, in the timing diagrams 400a-b the X may indicate that the data strobe signal DQS is no longer being received by the memory (e.g., because a controller stopped providing it after sending the write data and commands). In some embodiments, a set number of pulses of the data strobe clock signal DQS may be provided along with the write command, and after that set number of pulses is provided, the data strobe clock signal may stop being provided.

Figure 5:
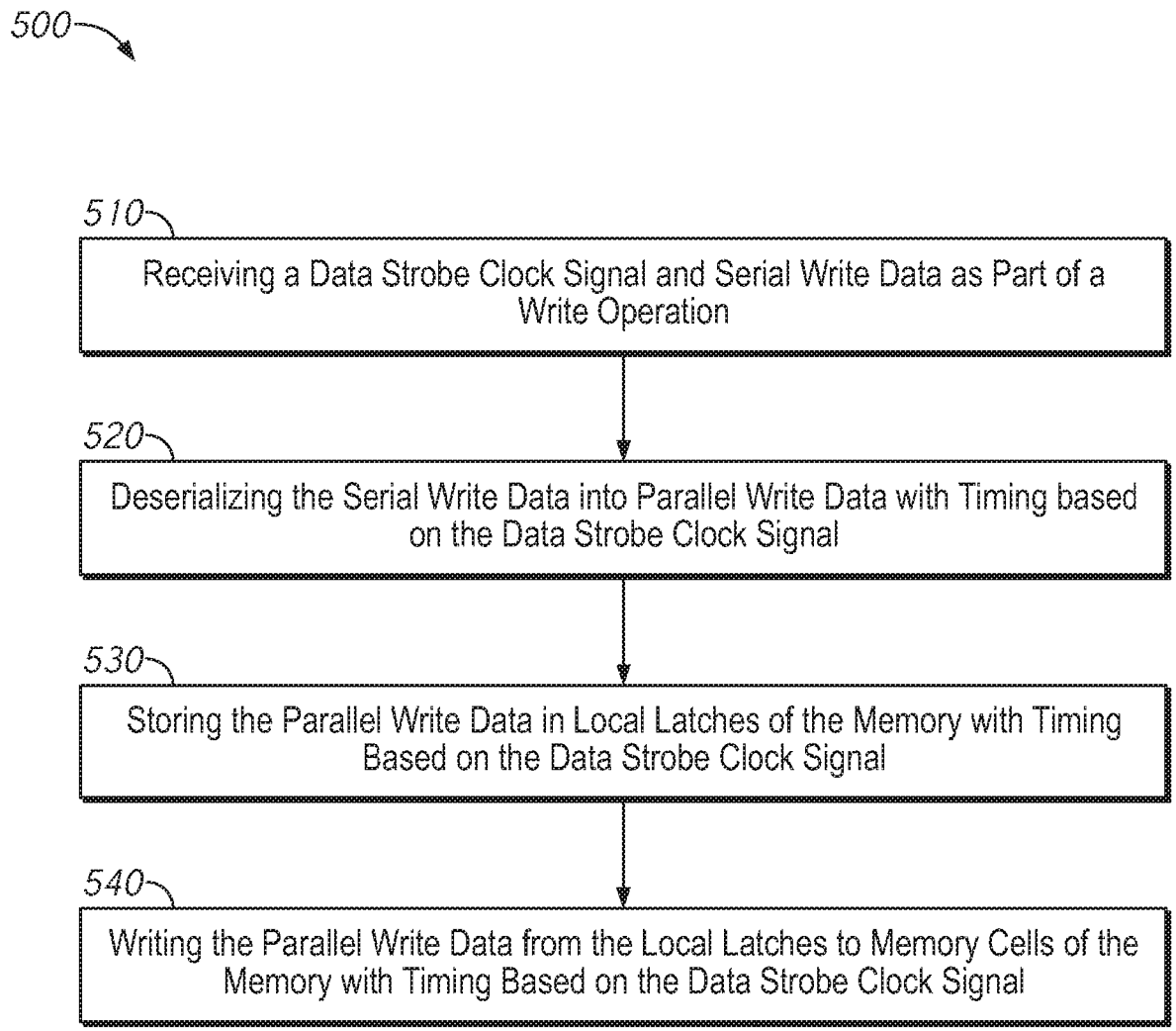
FIG. 5 is a flow chart of a method of deserializing and writing data to a memory using a data strobe signal according to some embodiments of the present disclosure.

FIG. 5 is a flow chart of a method of deserializing and writing data to a memory using a data strobe signal according to some embodiments of the present disclosure. The method 500 may, in some embodiments, be performed by one or more of the components described in FIGS. 1-4.

The method 500 may begin with block 510, which describes receiving a data strobe clock signal and serial write data as part of a write operation. A controller of a memory device may perform a write operation on the memory device, and may provide a write command, write address(es), write data in serial format, and begin providing a data strobe clock signal. The memory may receive these signals along various terminals. The memory may include data strobe logic, which may generate one or more internal clock signals based on the data strobe clock signal. The data strobe clock signal and/or the internal signals derived therefrom may be used to control timing of the write operation. The data strobe clock signal may stop being provided by the controller after the write data is provided, and therefore the memory may stop receiving the data strobe clock signal.

Block 510 may generally be followed by block 520, which describes deserializing the serial write data into parallel write data with timing based on the data strobe clock signal. For example, the memory may generate various internal timing signals, such as divided clock signals based on the data strobe signals, and a count signal based on a count of the divided clock signals. These may be used to control the timing with which various parts of the deserialization process occurs. For example, the deserializer may include several latch circuits, which may be clocked to the divided clock signals and/or bits of the count signal. The latches may help align the serial write bits into parallel write bits.

Block 520 may generally be followed by block 530, which describes storing the parallel write data in local latches of the memory with timing based on the data strobe clock signal. The local latches may be proximal to a memory array of the memory. The local latches may be clocked to a signal which indicates that the serial write data has been fully shifted into parallel write data. For example, the local latches may be clocked to a final bit of the count signal.

Block 530 may generally be followed by block 540, which describes writing the parallel write data from the local latches to memory cells of the memory with timing based on the data strobe clock signal. In order to write data, rows and/or columns of the memory array may be activated based on an address which indicates which rows/columns to activate, with timing based on the data strobe clock signal. For example, a signal, such as a final bit of the count signal, may be used to activate one or more selected bit lines of the memory array, and the write data may be loaded from the local latches along those activated bit lines.

In some embodiments, the memory may also perform a read operation, which may be controlled by a system clock signal different from the data strobe clock signal. The memory may receive the system clock (e.g., from a controller) along with a read command and read address as part of a read operation. Bit lines of the memory may be activated with timing based on the system clock, and which bit lines are activated may be based on the read address. Data may be read out along the activated bit lines and stored in the local latches with timing based on the system clock. The parallel read data in the local latches may then be serialized (also with timing based on the system clock) and provided at data terminals of the memory (e.g., to the controller).

In some embodiments, the memory may receive multiple data strobe clock signals, each associated with one or more data terminals. The write data received at each data terminal may be deserialized with timing based on the data strobe clock signal associated with that data terminal.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
   a clock terminal configured to receive a system clock signal;
   a data strobe terminal configured to receive a data strobe clock signal as part of a write operation, wherein the data strobe clock signal is different than the system clock signal;
   a deserializer circuit configured to convert received serial write data into parallel write data with timing based on the data strobe clock signal; and
   a memory array comprising a plurality of bit lines, wherein selected ones of the plurality of bits lines are activated with timing based on the data strobe clock signal, and wherein the parallel write data is provided to the activated ones of the plurality of bit lines.

2. The apparatus of claim 1, further comprising a plurality of local latches each configured to hold a bit of the parallel write data, wherein the plurality of local latches are configured to latch the respective bit of the parallel write data with timing based on the data strobe clock signal.

3. The apparatus of claim 1, further comprising command/address terminals configured to receive a column address, wherein the selected ones of the plurality of bit lines are selected based on the column address.

4. The apparatus of claim 1, further comprising a data terminal configured to receive the parallel write data.

5. The apparatus of claim 1, further comprising a second data strobe terminal configured to receive a second data strobe clock signal, and wherein the deserializer circuit is further configured to convert a second set of received serial write data into a second set of parallel write data with timing based on the second data strobe clock signal.

6. The apparatus of claim 1, further comprising read logic configured to activate selected ones of the plurality of bit lines with timing based on clock signal as part of a read operation.

7. The apparatus of claim 1, further comprising a write logic circuit configured to generate column select signals with timing based on the data strobe clock signal but not the system clock signal during the write operation, wherein selected ones of the plurality of bit lines are activated responsive to the column select signals.

8. A system comprising:
a controller configured to provide a system clock and, as part of a write operation, is configured to provide a data strobe clock signal, serial write data, and a write address;
a memory device comprising:
a deserializer circuit configured to convert the serial write data to parallel write data with timing based on the data strobe clock signal;
a memory array comprising a plurality of bit lines; and
write logic configured to activate selected ones of the plurality of bit lines based on the write address with timing based on data strobe clock signal, wherein the parallel write data is written to memory cells along the activated selected ones of the plurality of bit lines.

9. The system of claim 8, wherein the controller is configured to begin providing the data strobe clock signal as part of a write operation, and stop providing the data strobe clock signal when the write operation is complete.

10. The system of claim 8, wherein the memory device is configured to read data from selected ones of the plurality of bit lines with timing based on the system clock.

11. The system of claim 8, wherein the deserializer circuit is configured to provide the parallel write data along a read/write bus, and wherein the memory device further comprises a plurality of local latches configured to latch the parallel write data off the read/write bus responsive to a count signal.

12. The system of claim 11, wherein the memory device further comprises a data strobe logic circuit configured to provide the count signal based on the data strobe clock signal.

13. The system of claim 12, wherein the data strobe logic is configured to generate a first divided clock signal and a second divided clock signal based on the data strobe clock signal, and wherein the count signal is provided based on a count of the first divided clock signal and the second divided clock signal.

14. The system of claim 12, wherein the count signal is a multibit signal, and wherein the data strobe logic circuit is configured to sequentially activate bits of the multibit signal, and wherein the write logic is configured to activate the selected ones of the plurality of bit lines based on a final bit of the multibit signal becoming active.

15. A method comprising:
receiving a system clock signal at a memory;
receiving a data strobe clock signal and serial write data as part of a write operation to the memory, wherein the data strobe clock signal is different than the system clock signal;
deserializing the serial write data into parallel write data with timing based on the data strobe clock signal;
storing the parallel write data in local latches of the memory with timing based on the data strobe clock signal; and
writing the parallel write data from the local latches to memory cells of the memory with timing based on the data strobe clock signal.

16. The method of claim 15, wherein writing the parallel write data includes activating a bit line of the memory with timing based on the data strobe clock signal.

17. The method of claim 15, wherein the data strobe clock signal is not received when the write operation is over.

18. The method of claim 15, further comprising:
receiving a read command at the memory as part of a read operation;
activating bit lines of the memory with timing based on the system clock as part of the read operation;
storing parallel read data from the activated bit lines in the local latches with timing based on the system clock as part of the read operation;
serializing the parallel read data into serial read data with timing based on the system clock as part of the read operation; and
providing the serial read data at a data terminal of the memory with timing based on the system clock as part of the read operation.

19. The method of claim 15, further comprising:
receiving a second data strobe clock signal and a second set of serial write data as part of the write operation to the memory; and
deserializing the seconds of serial write data into a portion of the parallel write data with timing based on the second data strobe clock.

20. The method of claim 15, further comprising:
generating a first divided data strobe signal and a second divided data strobe signal based on the data strobe clock signal;
counting pulses of the first and the second divided data strobe signals and providing a count signal based on the count of the pulses; and
storing the parallel write data in the local latches responsive to the count signal.

21. The method of claim 20, further comprising activating bit lines of the memory responsive to the count signal.

* * * * *